(12) United States Patent
Murase et al.

(10) Patent No.: US 9,796,289 B2
(45) Date of Patent: Oct. 24, 2017

(54) ELECTRIC VEHICLE AND DRIVING METHOD OF ELECTRIC VEHICLE

(75) Inventors: Takahito Murase, Kobe (JP); Takeshi Ikeda, Fujidera (JP)

(73) Assignee: Kawasaki Jukogyo Kabushiki Kaisha, Kobe-shi, Hyogo (JP)

(*) Notice: Subject to any disclaimer, the term of this patent is extended or adjusted under 35 U.S.C. 154(b) by 94 days.

(21) Appl. No.: 14/354,534

(22) PCT Filed: Oct. 26, 2011

(86) PCT No.: PCT/JP2011/005990
§ 371 (c)(1),
(2), (4) Date: Jun. 18, 2014

(87) PCT Pub. No.: WO2013/061370
PCT Pub. Date: May 2, 2013

(65) Prior Publication Data
US 2014/0292235 A1 Oct. 2, 2014

(51) Int. Cl.
*B60K 11/08* (2006.01)
*B60W 10/00* (2006.01)
(Continued)

(52) U.S. Cl.
CPC ............. *B60L 11/1861* (2013.01); *B60L 3/02* (2013.01); *B60L 3/04* (2013.01); *B60L 11/1822* (2013.01);
(Continued)

(58) Field of Classification Search
CPC .................................................... B60K 6/365
See application file for complete search history.

(56) References Cited

U.S. PATENT DOCUMENTS 4,074,017 A * 2/1978 Kinsey ................ H01M 2/20
429/1
5,937,622 A * 8/1999 Carrier ................ A01D 34/006
56/10.2 R
(Continued)

FOREIGN PATENT DOCUMENTS

CN 201343090 Y * 11/2009
JP 04085186 A 3/1992
(Continued)

OTHER PUBLICATIONS

European Patent Office, Corrected European Search Report Issued in Application No. 11874729.4, dated Jul. 11, 2016, Original dated Jun. 14, 2016, 8 pages.
(Continued)

*Primary Examiner* — Eduardo Colon Santana
*Assistant Examiner* — Cortez Cook
(74) *Attorney, Agent, or Firm* — Alleman Hall Creasman & Tuttle LLP

(57) ABSTRACT

An electric vehicle comprises an electric motor for driving a wheel; a main battery for activating the electric motor; a case to which a sub-battery for activating the electric motor is detachably mounted; a connection terminal to which a terminal of the sub-battery is connected; a mounting detecting sensor for detecting that the connection terminal is connected to the terminal of the sub-battery; and a controller which detects the SOCs of the batteries and is configured such that electric power is supplied preferentially from the mounted sub-battery to the electric motor, when the SOC of the sub-battery is equal to or greater than a predetermined value, and electric power is supplied from the main battery to the electric motor, when the SOC of the sub-battery is less than the predetermined value.

16 Claims, 8 Drawing Sheets

(51) Int. Cl.
*B60L 11/18* (2006.01)
*B62K 11/04* (2006.01)
*G01R 31/36* (2006.01)
*B60L 3/02* (2006.01)
*B60L 3/04* (2006.01)

(52) U.S. Cl.
CPC ........... *B60L 11/1868* (2013.01); *B62K 11/04* (2013.01); *G01R 31/3606* (2013.01); *B60L 2200/12* (2013.01); *B60L 2250/10* (2013.01); *B62K 2204/00* (2013.01); *B62K 2208/00* (2013.01); *Y02T 10/7005* (2013.01); *Y02T 10/7044* (2013.01); *Y02T 10/7066* (2013.01); *Y02T 10/7072* (2013.01); *Y02T 90/124* (2013.01); *Y02T 90/14* (2013.01)

(56) References Cited

U.S. PATENT DOCUMENTS

| | | | | |
|---|---|---|---|---|
| 6,741,065 | B1* | 5/2004 | Ishii | B60L 11/1816 320/122 |
| 2007/0074928 | A1* | 4/2007 | Okada | B62D 5/04 180/444 |
| 2007/0222413 | A1* | 9/2007 | Kinoshita | B60L 11/1868 320/104 |
| 2008/0073397 | A1 | 3/2008 | Rehschuh | |
| 2010/0012416 | A1* | 1/2010 | Chan | B62J 7/04 180/219 |
| 2010/0138087 | A1 | 6/2010 | Takaoka | |
| 2010/0155162 | A1* | 6/2010 | Nakamura | B60L 11/187 180/65.29 |
| 2011/0027632 | A1* | 2/2011 | Higashino | B60K 1/04 429/83 |
| 2012/0312612 | A1* | 12/2012 | Harrison, III | B60K 1/04 180/68.5 |
| 2013/0228389 | A1* | 9/2013 | Nakashima | B62K 11/10 180/220 |

FOREIGN PATENT DOCUMENTS

| | | | |
|---|---|---|---|
| JP | H665184 U | 9/1994 | |
| JP | 2002254934 A | 9/2002 | |
| JP | 2006096105 A | 4/2006 | |
| JP | 2008542117 A | 11/2008 | |
| JP | 2010028881 A | * 2/2010 | ......... B60L 11/1855 |
| JP | 2011131701 A | 7/2011 | |

OTHER PUBLICATIONS

ISA Japanese Patent Office, International Search Report of PCT/JP2011/005990, Feb. 7, 2012, WIPO, 2 pages.

* cited by examiner

ELECTRIC VEHICLE AND DRIVING METHOD OF ELECTRIC VEHICLE

TECHNICAL FIELD

The present invention relates to an electric vehicle such as an electric motorcycle (electric two-wheeled vehicle) including an electric motor as a driving power source, and a driving method of the electric vehicle.

BACKGROUND ART

In recent years, an electric motorcycle which travels using as a driving power source an electric motor activated by a battery has been proposed, in place of a motorcycle including a gasoline engine as the driving power source.

The electric motorcycle has an advantage in that it does not cause environmental destruction or the like because it does not emit exhaust gases. Therefore, it is expected that the electric motorcycle will be widely used in the future. However, the electric motorcycle cannot travel for a long distance using one battery. To enable the electric motorcycle to travel for a long distance, it is necessary to mount many batteries to its vehicle body.

FIGS. 9 and 10 show an example of the electric motorcycle incorporating many batteries (see Patent Literature 1). Hereinafter, the moving direction of the vehicle body of the electric motorcycle will be referred to as "forward", and its opposite direction will be referred to as "rearward." In this electric motorcycle, a front cover 100 is provided in front of a head pipe 13 extending downward from the widthwise center portion of a handle 12, and a plurality of cylindrical batteries 95 are placed at upper and lower sides on the rear surface of the front cover 100. An electric motor 4 which is supplied with electric power from the batteries 95 is positioned in the vicinity of a rear wheel 90 and rotates the rear wheel 90. Because of the many batteries 95 mounted to the vehicle body, the capacity of the whole batteries 95 increases, but the vehicle body is able to travel for a long distance.

CITATION LIST

Patent Literature

Patent Literature 1: Japanese-Laid Open Patent Application Publication No. 2006-96105

SUMMARY OF INVENTION

Technical Problem

In the electric motorcycle disclosed in Patent Literature 1, since many batteries are mounted to the vehicle body, the vehicle body can travel for a long distance. However, the vehicle body has a heavy weight because of the many batteries mounted thereto. Although the vehicle body can travel for a short distance using a few batteries, a rider cannot enjoy light steering of the vehicle body, because of the many batteries mounted thereto. To allow the rider to enjoy light steering, the batteries had better be reduced in number. However, if the batteries are reduced in number, the vehicle body cannot travel for a long distance.

An object of the present invention is to provide an electric vehicle which allows sufficient SOC (state of charge) of a battery to be ensured during long distance travel and a rider to enjoy light steering of a vehicle body during short distance travel.

Solution to Problem

An electric vehicle of the present invention comprises an electric motor mounted to a vehicle body to drive a wheel; a main battery for activating the electric motor; a sub-battery mounting section to which a sub-battery for activating the electric motor is detachably mounted; a connection terminal to which a terminal of the sub-battery mounted to the sub-battery mounting section is connected; a sub-battery detecting section for detecting that the connection terminal is connected to the terminal of the sub-battery; a SOC detecting section for detecting SOC of the main battery and SOC of the sub-battery; and a controller which is electrically connected to the electric motor, the main battery, the connection terminal, the sub-battery detecting section, and the SOC detecting section; wherein the controller has a switching function in which: when the sub-battery detecting section detects that the connection terminal is connected to the terminal of the sub-battery, and the SOC detecting section detects that the SOC of the sub-battery is equal to or greater than a predetermined value, electric power is supplied preferentially from the sub-battery to the electric motor during travel of a vehicle body, and when the sub-battery detecting section detects that the connection terminal is connected to the terminal of the sub-battery, and the SOC detecting section detects that the SOC of the sub-battery is less than the predetermined value, the electric power is supplied from the main battery to the electric motor.

When the vehicle body travels for a long distance, the sub-battery is preferably mounted to the vehicle body. In accordance with the above configuration, when the SOC of the sub-battery is equal or greater than the predetermined value, the electric power is supplied preferentially from the sub-battery to the electric motor during travel of the vehicle body. When the SOC of the sub-battery becomes less than the predetermined value, the battery for supplying the electric power to the electric motor is switched to the main battery. This makes it possible to ensure sufficient SOCs of the batteries when the vehicle body travels for a long distance. Since the sub-battery is used preferentially, only the sub-battery may be re-charged in many cases. Since the sub-battery is detachable, it can be charged easily.

When the vehicle body travels for a short distance, the sub-battery may be detached from the vehicle body and the electric power may be supplied from the main battery to the electric motor. Because of the absence of the sub-battery, the vehicle body can be reduced in weight, and a rider can enjoy light steering of the vehicle body.

In the electric vehicle, the sub-battery mounting section may include a plurality of sub-battery mounting sections; the connection terminal may include a plurality of connection terminals corresponding to the plurality of sub-batteries, respectively, the electric vehicle may comprise: an operation state detecting section which detects an operation state of an accelerator and is connected to the controller; the SOC detecting section may be configured to detect SOCs of the plurality of sub-batteries mounted to the plurality of sub-battery mounting sections, respectively; and when the operation state detecting section detects an operation of an accelerator for accelerating the vehicle body, the controller may supply to the electric motor the electric power preferentially from the sub-battery which has a higher SOC, among the plurality of sub-batteries.

During the acceleration of the vehicle body, a current with a great magnitude is flowed in the electric motor, and therefore, the battery which has a higher SOC is preferably used. In accordance with the above configuration, since the electric power is supplied preferentially from the battery which has a higher SOC to the electric motor, during acceleration of the vehicle body, the vehicle body can be accelerated smoothly.

When the sub-battery detecting section detects that the connection terminal is connected to the terminal of the sub-battery, the controller may supply to the electric motor the electric power preferentially from the battery which has a higher SOC, among the main battery and the sub-battery, during travel of the vehicle body, based on a result of the detection of the SOC detecting section.

In accordance with the above configuration, the electric power is supplied to the electric motor preferentially from the battery which has a higher SOC during travel of the vehicle body. When the SOC of the battery becomes less, the battery for supplying the electric power to the electric motor is switched to another battery. This makes it possible to ensure sufficient SOC of the battery, for example, in a case where the vehicle body travels for a long distance.

When the operation state detecting section detects an operation of an accelerator for accelerating the vehicle body, the controller may supply to the electric motor the electric power from the sub-battery which has a higher SOC, among the plurality of the sub-batteries.

In accordance with the above configuration, by supplying the electric power from the plurality of batteries to the electric motor, the load imposed on the sub-batteries can be dispersed. In this way, the load imposed on each of the sub-batteries can be lessened.

The electric vehicle may comprise a falling detecting sensor for detecting that the vehicle body has fallen down; and when the controller detects that the vehicle body has fallen down based on a signal output from the falling detecting sensor, the controller may stop supply of the electric power from the sub-battery and the main battery.

In accordance with the above configuration, when the vehicle body has fallen down, supply of the electric power from the sub-battery and the main battery is stopped. Therefore, when the vehicle body has fallen down, the electric motor can be deactivated.

The electric vehicle may comprise a regeneration means provided between the controller and the connection terminal and configured to recover electric energy by converting inertia rotational power of the electric motor into the electric energy which is charged into the sub-battery or the main battery corresponding to the connection terminal.

In accordance with the above configuration, when the electric motor is rotating with an inertia force, the electric energy is recovered in such a manner that the electric energy derived from the resulting rotational power is charged into the sub-battery or the main battery. Therefore, exhaustion of the sub-battery or the main battery can be suppressed.

The sub-battery mounting section may be a case which is detachably mounted to the vehicle body; and the case may have an opening through which cooling air is taken into the case, and the opening may be opened and closed by a lid member provided on the case.

In accordance with the above configuration, for example, when the vehicle body travels in a state in which the sub-battery is mounted to the vehicle body, the opening of the case is closed by the lid member. In this way, dust and the like do not adhere to the battery and smooth electric power supply can be implemented. For example, when the use of the sub-battery is finished, the lid member is opened and cooling air is taken into the case, thereby allowing the sub-battery to be cooled efficiently.

The case may be located at a rear side of a seat which is mounted to the vehicle body and on which a rider is seated. In accordance with the above configuration, the case does not interfere with the rider seated on the vehicle body.

A method is provided for driving an electric vehicle of the present invention, which includes an electric motor mounted to a vehicle body to drive a wheel; a main battery for activating the electric motor; a sub-battery mounting section to which a sub-battery for activating the electric motor is detachably mounted; a connection terminal to which a terminal of the sub-battery mounted to the sub-battery mounting section is connected; a sub-battery detecting section for detecting that the connection terminal is connected to the terminal of the sub-battery; and a SOC detecting section for detecting SOC of the main battery and SOC of the sub-battery. The method comprises the steps of: detecting that the sub-battery is mounted to the sub-battery mounting section, using the sub-battery detecting section; supplying electric power preferentially from the sub-battery to the electric motor during travel of a vehicle body, when the sub-battery detecting section detects that the sub-battery is mounted to the sub-battery mounting section, and the SOC detecting section detects that the SOC of the sub-battery is equal to or greater than a predetermined value; and supplying the electric power from the main battery to the electric motor, when the sub-battery detecting section detects that the sub-battery is mounted to the sub-battery mounting section and the SOC detecting section detects that the SOC of the sub-battery is less than the predetermined value.

When the vehicle body travels for a long distance, the sub-battery is preferably mounted to the vehicle body. In accordance with the method including the above steps, when the SOC of the sub-battery is equal or greater than the predetermined value, the electric power is supplied preferentially from the sub-battery to the electric motor during travel of the vehicle body. When the SOC of the sub-battery becomes less than the predetermined value, the battery for supplying the electric power to the electric motor is switched to the main battery. This makes it possible to ensure sufficient SOCs of the batteries when the vehicle body travels for a long distance. Since the sub-battery is used preferentially, only the sub-battery may be re-charged in many cases. Since the sub-battery is detachable, it can be charged easily.

When the vehicle body travels for a short distance, the sub-battery may be detached from the vehicle body and the electric power may be supplied from the main battery to the electric motor. Because of the absence of the sub-battery, the vehicle body can be reduced in weight, and the rider can enjoy light steering of the vehicle body.

Advantageous Effects of Invention

In the electric vehicle of the present invention, when the vehicle body travels for a long distance, sufficient SOC of the battery can be ensured by mounting the sub-battery to the vehicle body. After the travel, the sub-battery can be re-charged easily.

When the vehicle body travels for a short distance, the sub-battery may be detached from the vehicle body and the electric power may be supplied from the main battery to the electric motor. Because of the absence of the sub-battery, the vehicle body can be reduced in weight, and the rider can enjoy light steering of the vehicle body.

DESCRIPTION OF EMBODIMENTS

Hereinafter, an electric vehicle according to an embodiment of the present invention, specifically, an electric motorcycle (electric two-wheeled vehicle), will be described with reference to the drawings. Hereinafter, throughout the drawings, the same or corresponding components are designated by the same reference symbols and will not be described in repetition. Also, hereinafter, a rightward or leftward direction is from the perspective of a rider straddling the electric motorcycle.

Figure 1:
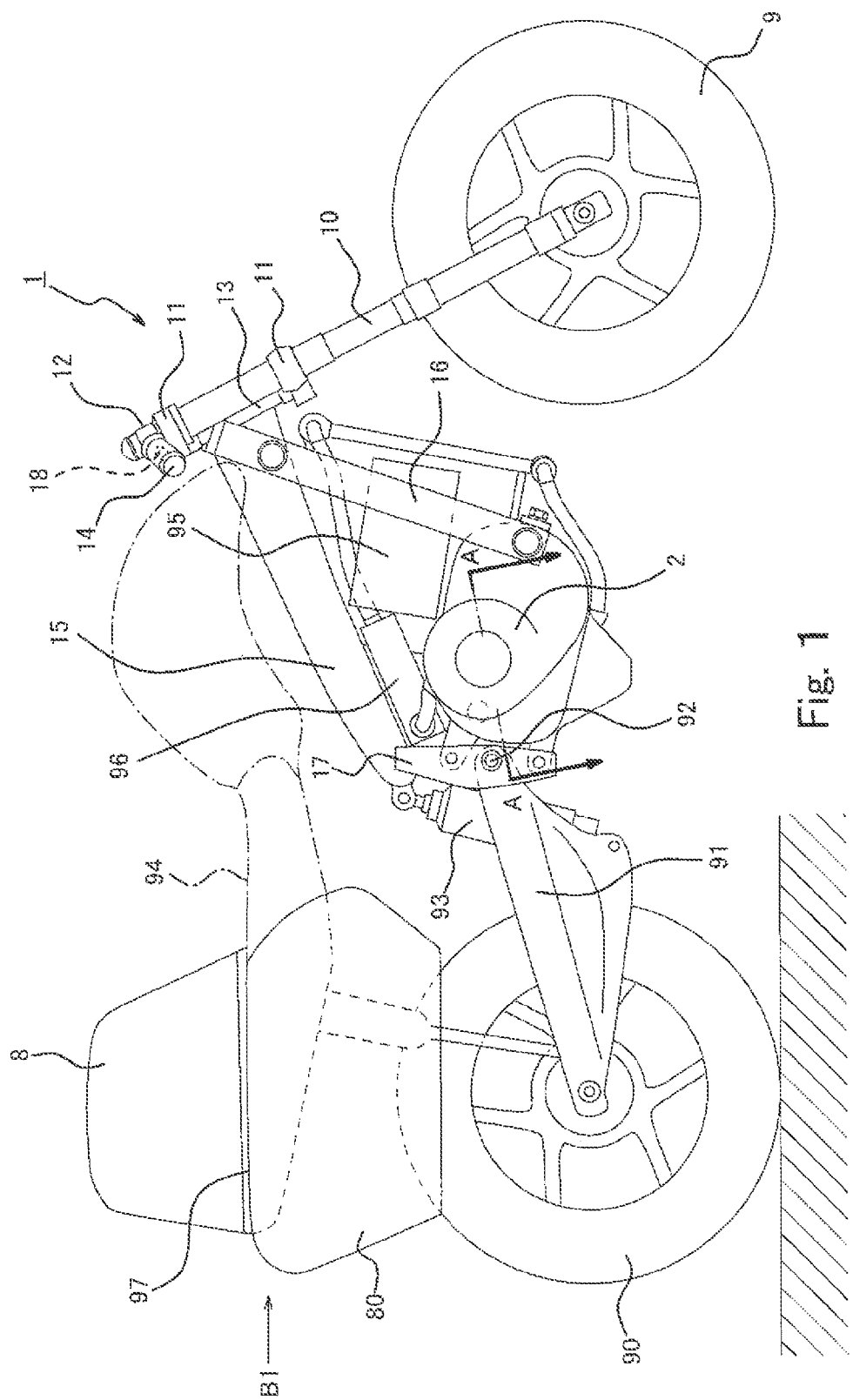
FIG. 1 is a side view of an electric motorcycle according to an embodiment of the present invention.

FIG. 1 is a side view of an electric motorcycle 1 according to an embodiment of the present invention. FIG. 1 shows major components such as a vehicle body frame, a power plant as will be described later, and wheels. The electric motorcycle 1 according to the present embodiment may be supplied with electric power from a main battery fastened to its vehicle body and sub-batteries which are detachably mounted to the vehicle body, as will be described later.

As shown in FIG. 1, the vehicle body frame of the electric motorcycle 1 includes a main frame 15 extending rearward such that it is inclined downward, a pair of right and left front forks 10 extending forward from the front end portion of the main frame 15 such that they are inclined obliquely downward, a head pipe 13 placed between the upper end portions of the front forks 10, and a pair of right and left down frames 16 extending rearward from the head pipe 13 such that they are inclined obliquely downward.

The upper frame portion of a pivot frame 17 which is a frame member is attached to the rear end portion of the main frame 15. The upper frame portion of the pivot frame 17 extends in a rightward or leftward direction which is substantially perpendicular to the lengthwise direction of the main frame 15. The front end portion of a power plant 2, as will be described later, is mounted to the lower end portion of the down frame 16, while the rear end portion of the power plant 2 is mounted to the lower end portion of the pivot frame 17.

The upper end portions of the front forks 10 are coupled to a bar-type handle 12 extending in the rightward or leftward direction via a pair of upper and lower brackets 11.

The handle 12 is provided on a right end portion thereof with an accelerator grip 14 which is gripped by the rider's right hand and rotated by twisting the rider's wrist. The handle 12 is attached with a grip sensor 18 for detecting the rotational angle of the accelerator grip 14.

A front wheel 9 which is a steering wheel is rotatably mounted to the lower end portions of the front forks 10. In the vicinity of the handle 12, there are provided an alarm lamp (not shown) indicating that the electric power left in the electric motorcycle 1 is less and an unmounted state indicator lamp (not shown) indicating that the sub-battery (described later) is not mounted.

A swing arm 91 is placed between the left frame portion and right frame portion of the pivot frame 17 such that the front end portions of the swing arm 91 are mounted to the left frame portion and right frame portion of the pivot frame 17 and the swing arm 91 is vertically pivotable. A rear wheel 90, which is a drive wheel, is rotatably mounted to the rear end portion of the swing arm 91. The lower end portion of a suspension unit 93 is mounted to the lengthwise center portion of the swing arm 91.

A seat 94 which is straddled by the rider is placed above the swing arm 91. The seat 94 is mounted to a rear frame (not shown) mounted to the main frame 15. The seat 94 extends rearward and a mounting bracket 97 is provided on the upper surface of the rear end portion of the seat 94. A top case 8 having an inner storage space is detachably mounted onto the mounting bracket 97. Side cases 80, each having an inner storage space, are detachably mounted to both sides of the rear end portion of the seat 94. The top case 8 and the side cases 80 are provided at a rear side of the seat 94, and therefore do not interfere with the rider seated on the seat 94.

In a space formed between the front wheel 9 and the rear wheel 90, there are provided a main battery 95 for supplying the electric power to the power plant 2, and a power supply control unit 96 containing a controller (described later), in addition to the power plant 2. The main battery 95 is fastened to the down frame 16 by means of, for example, screws. In principle, the rider does not detach the main battery 95 except for during a repair work or a replacement work. Alternatively, the main battery 95 may be easily detachable for replacement.

A falling detecting sensor for detecting that the vehicle body has fallen down when the vehicle body has fallen down, is attached to a desired location of the vehicle body frame. The role of the falling detecting sensor will be described later.

(To Case and Side Case)

Figure 2:
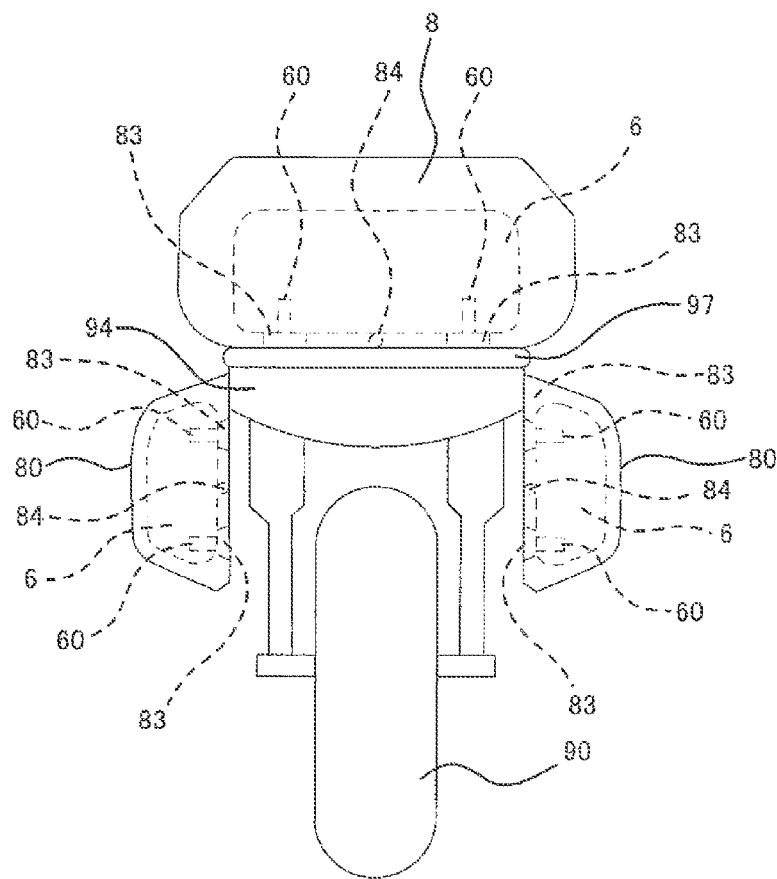
FIG. 2 is a rear view of the electric motorcycle, when viewed in the direction of an arrow B1 of FIG. 1.

FIG. 2 is a rear view of the electric motorcycle 1, when viewed in the direction of an arrow B1 of FIG. 1, and shows the top case 8 and the side cases 80. The top case 8 and the side cases 80 have hollow structures, respectively, and are configured to store the sub-batteries 6 in inner storage spaces thereof, respectively. The sub-batteries 6 are detachably mounted to the top case 8 and the side cases 80, respectively. Each of the sub-batteries 6 is a battery with a great capacity and is provided with a pair of power supply terminals 60. Connection terminals 83 are provided on each of the bottom surfaces of the top case 8 and the inner side surfaces of the side cases 80. When the sub-battery 6 has run out, the sub-battery 6 is detached from the corresponding one of the top case 8 and the side cases 80 and then charged. In other words, the top case 8 and the side cases 80 constitute a "sub-battery mounting section" of the present invention.

The connection terminals 83 are connected to the power supply control unit 96 through a power supply path (not shown in FIG. 2). The sub-batteries 6 supply the electric power to the power supply control unit 96 via the connection terminals 83. Mounting detecting sensors 84 for detecting that the connection terminals 83 are connected to the terminals 60 of the sub-batteries 6, are mounted inside of the top case 8 and the side cases 80. In other words, the mounting detecting sensors 84 constitute a "sub-battery detecting section" of the present invention.

Figure 3:
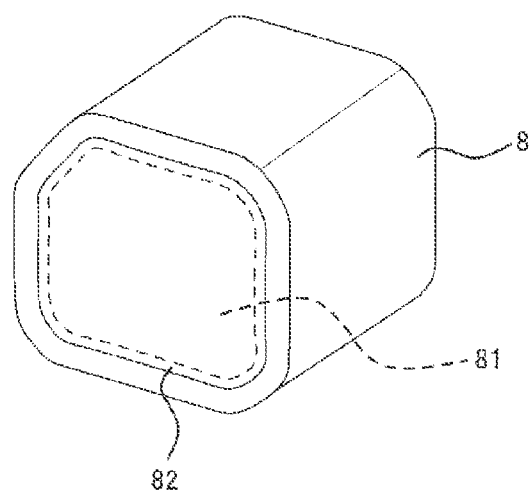
FIG. 3 is a perspective view of a top case.

FIG. 3 is a perspective view of the top case 8. For example, an opening 81 is formed on the back surface of the top case 8. A lid member 82 is slidably attached onto the top case 8 to expose and close the opening 81. For example, when the electric motorcycle 1 travels in a state in which the sub-battery 6 is mounted in the top case 8, the lid member 82 closes the opening 81 to prevent dust or the like from adhering to the sub-battery 6. For example, when the use of the sub-battery 6 is terminated, outside air is taken into the interior of the top case 8 through the exposed opening 81, and thereby the sub-battery 6 can be cooled efficiently. The storage space of the top case 8 is formed to have a greater volume than the sub-battery 6. That is, the top case 8 has an extra space for storing articles to be transported, in addition to the sub-battery 6. Therefore, the articles can be stored in this extra space through the opening 81. If a quick charger is stored in the top case 8 as the articles, it can quickly charge the sub-battery 6 which has lower SOC (state of charge), which is convenient. Each of the side cases 80 may also be provided with the opening 81 and the lid member 82. Each of the side cases 80 has an extra space for storing articles to be transported, in addition to the sub-battery 6.

(Power Plant)

Figure 4:
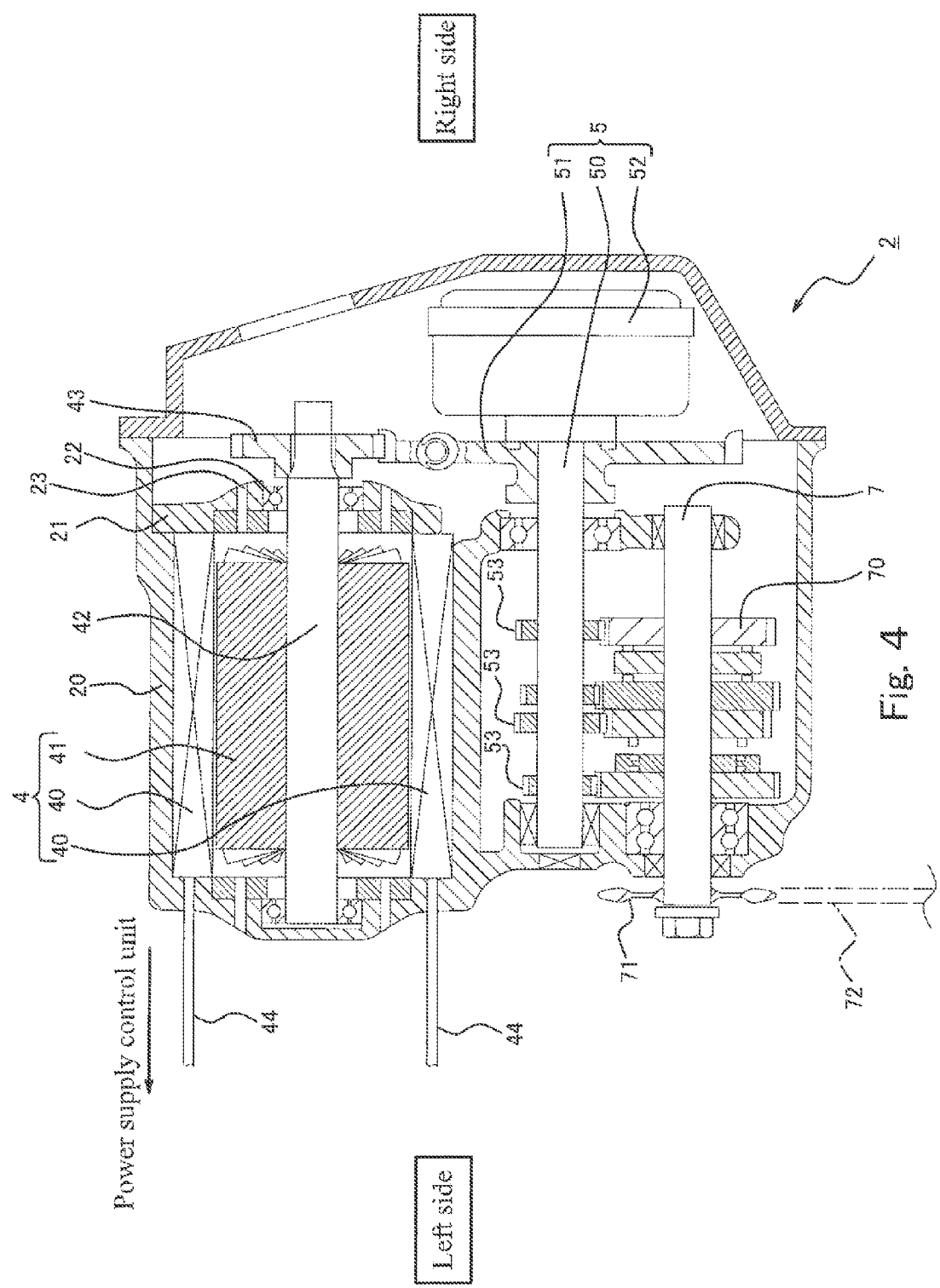
FIG. 4 is a cross-sectional view of a power plant which is cut away along a plane including line A-A of FIG. 1, and taken in the direction of the arrows along the line A-A of FIG. 1.

FIG. 4 is a cross-sectional view of the power plant 2 which is cut away along a plane including line A-A of FIG. 1, and taken in the direction of the arrows along the line A-A of FIG. 1. The power plant 2 includes a metal-made housing 20. The electric motor 4, which is a motor for travelling the vehicle (driving the rear wheel), is stored in the housing 20. A transmission 5 is placed behind the electric motor 4. The electric motor 4 includes a stator 40 fastened to the inner surface of the housing 20, and a rotor 41 which is placed inward relative to the stator 40 and rotates around a rotary shaft 42. Electric wires 44 extending from the power supply control unit 96 to the housing 20 are connected to the stator 40. The power supply control unit 96 supplies the electric power to the electric motor 4 via the electric wires 44.

An output gear 43 is mounted on the tip end portion of the rotary shaft 42 protruding from the electric motor 4. The transmission 5 includes a multiplate clutch 52 located at the right end portion of the housing 20, a clutch shaft 50 protruding leftward from the multiplate clutch 52, and a clutch gear 51 which is fitted to the clutch shaft 52 and configured to mesh with the output gear 43. The multiplate clutch 52 performs switching between a state in which the rotational power from the electric motor 4 is permitted to be an input to the transmission 5 and a state in which the rotational power from the electric motor 4 is inhibited from being an input to the transmission 5. The clutch shaft 50 is provided with a plurality of gears 53 in a region from a location at which the clutch gear 51 is provided toward its tip end portion.

The transmission 5 includes an output shaft 7 extending substantially in parallel with the clutch shaft 50. The output shaft 7 is provided with a gear train 70 including a plurality of gears arranged in the rightward or leftward direction. When the clutch shaft 50 is moved in the rightward or leftward direction, and thereby the mesh-in state between the gears of the gear train 70 and the gears 53 of the clutch shaft 50 is changed, a reduction gear ratio between input rotation and output rotation, i.e., gear position of the transmission 5, is changed.

The above described change in the reduction gear ratio is performed by the rider's operation of a shift pedal (not shown). A sprocket 71 is mounted on the left end portion of the output shaft 7 which outputs the rotation with the changed speed, from the electric motor 4. A chain 72 as indicated by a virtual line in FIG. 4, is wrapped around the sprocket 71 and a sprocket (not shown) of the rear wheel 90. Alternatively, the clutch and the transmission 5 may be omitted from the power plant 2.

(Power Supply Control Unit)

Figure 5:
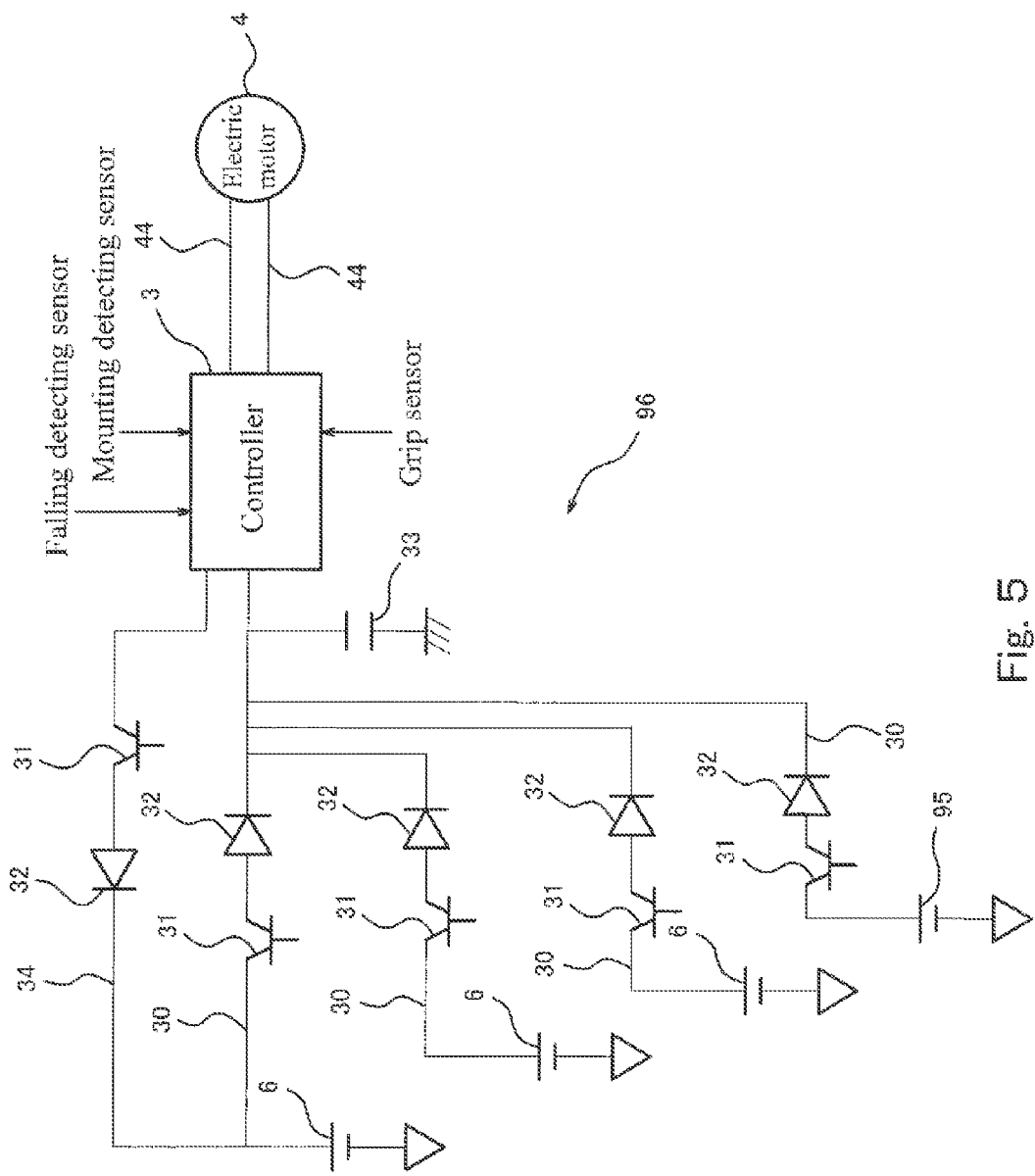
FIG. 5 is a block diagram of a power supply control unit.

FIG. 5 is a block diagram of the power supply control unit 96. A controller 3 is built into the power supply control unit 96. The electric wires 44 extending from the electric motor 4 are connected to the controller 3. The controller 3 is connected to the main battery 95 and the three sub-batteries 6 via power supply paths 30, respectively, and can be supplied with the electric power from the four batteries 6 and 95 in total. The controller 3 is capable of sending the electric power from the four batteries 6 and 95 to the electric motor 4. In addition, the controller 3 is capable of detecting the SOCs of the batteries 6 and 95 by measuring the voltages of the batteries 6 and 95. In other words, the controller 3 constitutes a "SOC detecting section" of the present invention. Also, the controller 3 receives as inputs, signals from the mounting detecting sensors 84, a signal from the grip sensor 62, and a signal from the falling detecting sensor. The grip sensor 62 detects an operation state of the accelerator grip 14 which is caused by the rider's operation, and therefore constitutes an "operation state detecting section" of the present invention.

The lower limit value of the SOC of the main battery 95 and the lower limit value of the SOCs of the sub-batteries 6 are pre-set in the controller 3 as predetermined values, respectively. When the SOCs of the batteries 6 and 95 are less than the predetermined values, respectively, the controller 3 determines that the electric motorcycle 1 will not be able to travel any further, and provides an alarm to the rider. Specifically, the controller 3 turns ON an alarm lamp.

On each of the power supply paths 30, there are provided a switching element 31 comprising a transistor and a diode 32 which permits the electric power to be supplied only in the direction from the battery to the controller 3. The controller 3 is connected to the switching elements 31. The controller 3 performs switching between ON and OFF of these four switching elements 31 to permit the electric power to be supplied from the batteries to the controller 3 or inhibit the electric power from being supplied from the batteries to the controller 3. A capacitor 33 is provided between the diodes 32 and the controller 3 to eliminate a noise. The diodes 32 may be omitted from the power supply paths 30.

Between the controller 3 and each of the batteries 6 and 95, there is provided a regeneration power supply path 34 provided with the switching element 31 and the diode 32. Although FIG. 5 shows that the regeneration power supply path 34 is provided only between the controller 3 and one of the sub-batteries 6, for easier illustration, the regeneration power supply paths 34 are actually provided between the controller 3 and the batteries 6 and 95. Regeneration is defined as a function in which the electric motor operates as a generator by a travel inertia force transmitted from the drive wheel to the output shaft of the electric motor, and thereby electric energy is recovered by converting rotational energy of the rotor into the electric energy to be charged into the battery. To this end, the regeneration power supply path 34 is provided with the diode 32 to permit the electric power to be supplied only in the direction from the electric motor 4 to the battery. The controller 3 has an inverter function for converting the recovered electric energy into DC power which is supplied to and charged into the battery. In this way, exhaustion of the battery is prevented.

The present embodiment has a feature that, when the SOC of the sub-battery is equal to or greater than a predetermined value during travel of the vehicle body, the electric power is supplied preferentially from the sub-battery to the electric motor, rather than the main battery.

(Switching of Battery During Normal Travel)

Figure 6:
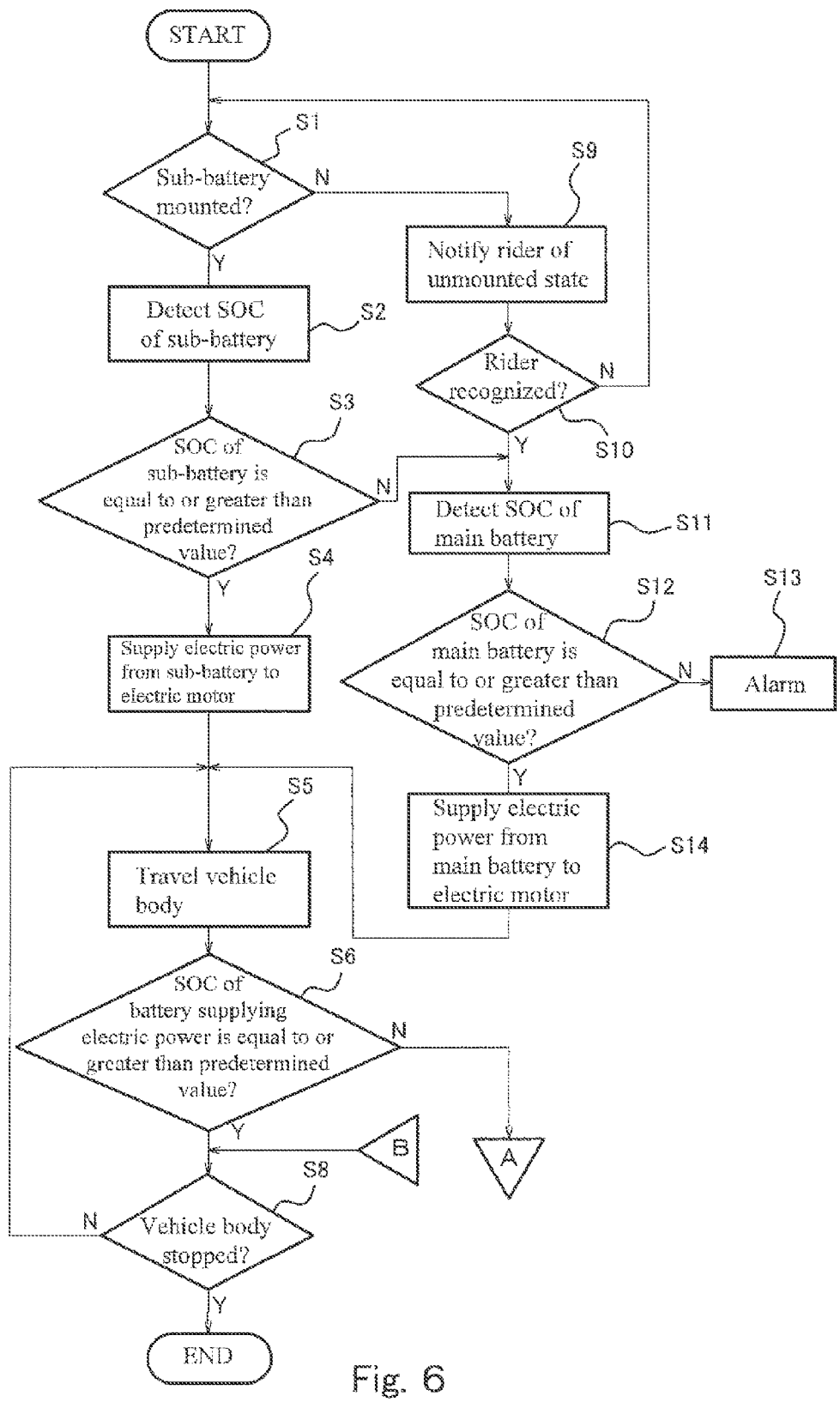
FIG. 6 is a flowchart showing a battery switching operation of the electric motorcycle according to the embodiment.
Figure 7:
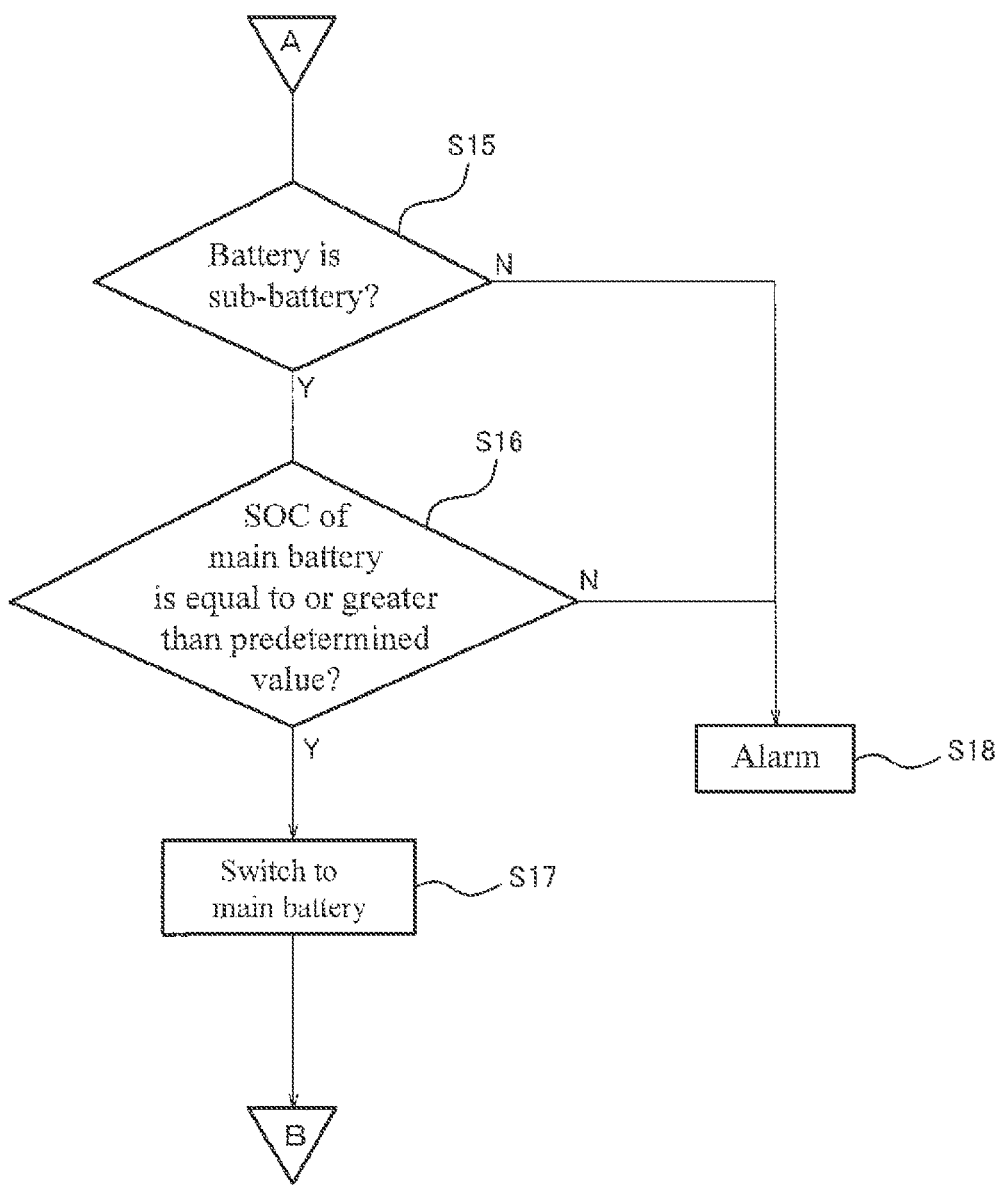
FIG. 7 is a flowchart showing a battery switching operation of the electric motorcycle according to the embodiment.

FIGS. 6 and 7 are flowcharts showing a battery switching operation of the electric motorcycle 1 according to the embodiment, and show the battery switching operation in the case of normal travel. Initially, when the electric motorcycle 1 starts travel, the controller 3 detects whether or not the sub-battery 6 is stored in the top case 8 or the side cases 80 based on the signal from the mounting detecting sensor 84 (step S1). When the controller 3 detects that the sub-battery 6 is stored in at least one of the cases 8 and 80, it detects the SOC of this sub-battery 6 (step S2), and detects whether or not the SOC is equal to or greater than the predetermined value (step S3). When the controller 3 determines that the sub-battery 6 is not stored in any one of the cases 8 and 80 in step S1, it turns ON the unmounted state indicator lamp to notify the rider that the sub-battery 6 is not mounted in any one of the cases 8 and 80 (step S9). When the rider recognizes that the sub-battery 6 is not mounted in any one of the cases 8 and 80 (step S10) and turns OFF the unmounted state indicator lamp, for example, the controller 3 detects the SOC of the main battery 95 (step S11). When the rider does not recognize that the sub-battery 6 is not mounted in any one of the cases 8 and 80, the controller 3 returns to step S1, and moves to step S2 after the rider mounts the sub-battery 6 in any one of the cases 8 and 80. When the rider does not mount the sub-battery 6 in any one of the cases 8 and 80 yet after the above procedure, the controller 3 continues to notify the rider that the sub-battery 6 is not mounted in any one of the cases 8 and 80 until the rider recognizes this.

When the controller 3 detects that the SOC of the sub-battery 6 is equal to or greater than the predetermined value, it turns ON the switching element 31 provided on the power supply path 30 connected to the sub-battery 6, supplies the electric power from the sub-battery 6 to the electric motor 4 (step S4), and causes the vehicle body to travel (step S5). In the case, the controller 3 may supply the electric power from one sub-battery 6, or simultaneously from two or three sub-batteries 6 to the electric motor 4. In a case where the controller 3 supplies the electric power from one sub-battery 6 in a state in which a plurality of sub-batteries 6 are mounted, it may firstly supply the electric power from the sub-battery 6 which has the highest SOC.

On the other hand, if the electric power is supplied from the sub-batteries 6 to the electric motor 4 even though the SOCs of all of the sub-batteries 6 are less than the predetermined value, it is more likely that the vehicle body will not be able to travel. In light of this, when the controller 3 detects that the SOCs of all of the sub-batteries 6 are less than the predetermined value in step S3, then it detects the SOC of the main battery 95 to confirm whether or not it is possible to supply the electric power from the main battery 95 to the electric motor 4 (step S11). When the controller 3 detects that the SOC of the main battery 95 is less than the predetermined value (step S12), it determines that the vehicle body will not be able to travel, and turns ON the alarm lamp to provide an alarm to the rider (step S13). When the controller 3 detects that the SOC of the main battery 95 is equal to or greater than the predetermined value (step S12), it supplies the electric power from the main battery 95 to the electric motor 4 (step S14), and causes the vehicle body to travel (step S5).

During the travel of the vehicle body, the controller 3 regularly detects the SOC of the battery 6, 95 continuously or regularly. When the controller 3 detects that the SOC of the battery 6, 95 which is supplying the electric power to the electric motor 4 is equal to or greater than the predetermined value, it continues to cause the vehicle body to travel (step S6). When the controller 3 detects that the SOC of the battery 6, 95 which is supplying the electric power is less than the predetermined value in step S6, it checks whether or not the battery which is supplying the electric power is the sub-battery 6 (step 15). The controller 3 conducts this checking by detecting which of the switching elements 31 is turned ON. When the controller 3 detects that the battery which is supplying the electric power is the sub-battery 6, it detects whether or not the SOC of the main battery 95 is equal to or greater than the predetermined value (step S16). When the controller 3 detects that the SOC of the main battery 95 is less than the predetermined value, it turns ON the alarm lamp to provide an alarm to the rider (step S18). When the controller 3 detects that the SOC of the main battery 95 is equal to or greater than the predetermined value, it switches the battery which supplies the electric power to the electric motor 4 from the sub-battery 6 to the main battery 95 (step S17), and continues to cause the vehicle body to travel. When the controller 3 detects that the battery which supplies the electric power is the main battery 95 in step S15, it turns ON the alarm lamp to provide an alarm to the rider (step S18).

When the rider stops the travel of the vehicle body, the controller 3 terminates the above described series of procedures (step S8). The phrase "rider stops the travel of the vehicle body" includes a case where the rider temporarily stops the vehicle body because of a traffic light or the like, and a case where the vehicle body straddled by the rider arrives at a destination place and the rider parks the vehicle body in the destination place. When the rider travels the vehicle body again, the controller 3 starts a control process in step S1 and the following steps.

When the falling detecting sensor detects that the vehicle body has fallen down in the middle of the travel of the vehicle body, the controller 3 inhibits the electric power from being supplied from the sub-batteries 6 and the main battery 95 to the electric motor 4, and deactivates the electric motor 4.

In the above described operation, when the SOC of the sub-battery 6 is equal to or greater than the predetermined value, the electric power is supplied preferentially from the sub-battery to the electric motor 4 during the travel of the vehicle body. When the SOC of the sub-battery 6 becomes less than the predetermined value, the battery for supplying the electric power to the electric motor 4 is switched to the main battery 95. This makes it possible to ensure sufficient SOCs of the batteries when the vehicle body travels for a long distance. After the travel, if it is found that the battery used during the travel was only the sub-battery 6, only the sub-battery 6 may be re-charged. Since the sub-battery 6 is detachable, re-charging of the sub-battery 6 can be easily carried out. When the vehicle body travels for a short distance, the rider may detach the sub-battery 6 from the top case 8 or the side case 80. The controller 3 switches the battery for supplying the electric power to the electric motor 4 to the main battery 95 by executing step S9 to Step S14. Because of the absence of the sub-battery 6, the vehicle body can be reduced in weight, and the rider can enjoy light travel with the vehicle body reduced in weight.

Although in the above case, the electric power is supplied preferentially from the sub-battery 6 to the electric motor 4, it may be supplied preferentially from the main battery 95 and the sub-battery 6 which has a higher SOC. This makes it possible to ensure sufficient SOCs of the batteries when the vehicle body travels for a long distance. Or, the rider may manually input a command to the controller 3 to select which of the batteries 6, 95 should preferentially supply the electric power to the electric motor 4.

During inertia travel of the vehicle body, the controller 3 turns ON the switching elements 31 provided on the regeneration power supply paths 34 to charge the batteries 6 and 95. In this case, the batteries 6 and 95 may be charged in such a way that the battery which has a lower SOC is preferentially charged earlier.

(Switching of Battery During Acceleration)

Figure 8:
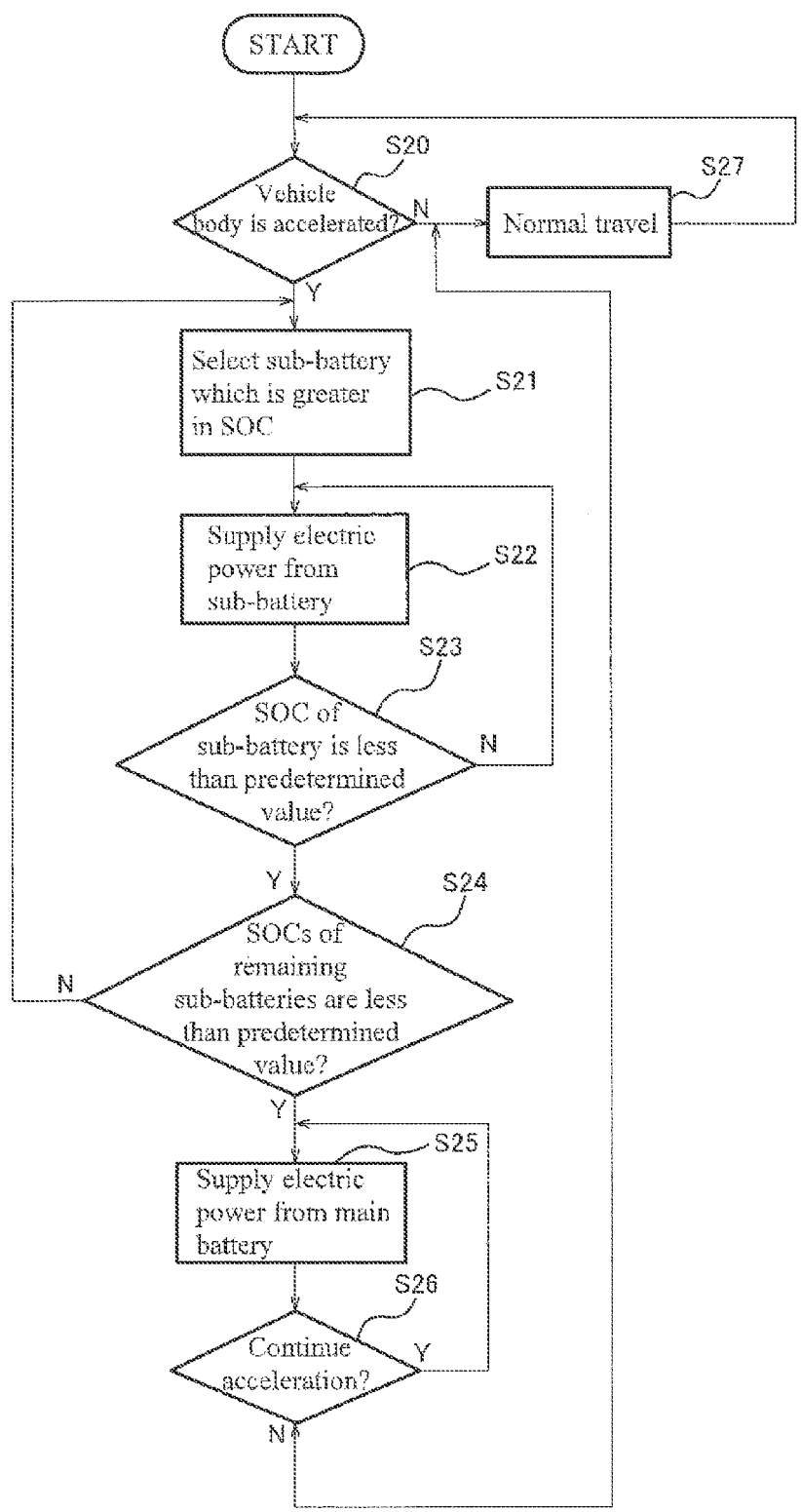
FIG. 8 is a flowchart showing a battery switching operation of the electric motorcycle according to the embodiment.
Figure 9:
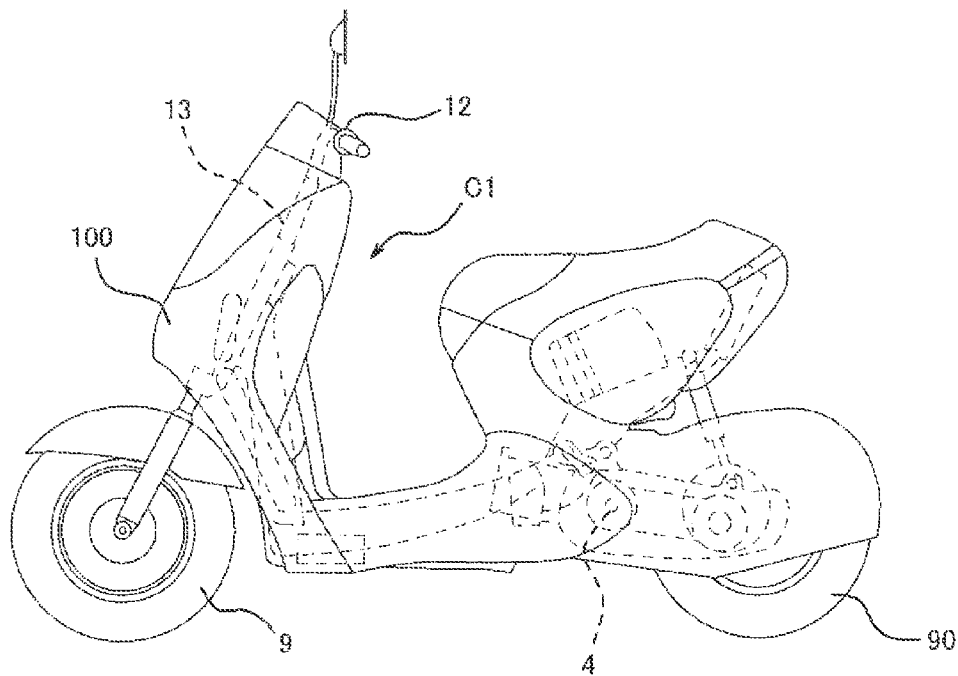
FIG. 9 is a side view of a conventional electric motorcycle.
Figure 10:
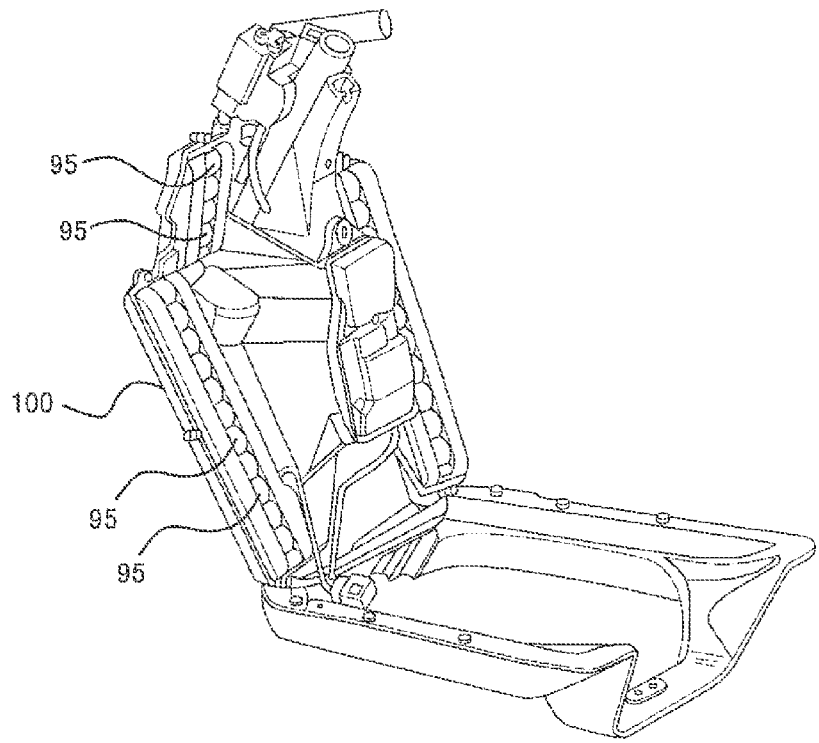
FIG. 10 is a perspective view of the conventional electric motorcycle, when viewed from a direction of C1 of FIG. 9.

To accelerate the vehicle body in the middle of the travel of the vehicle body, the rider rotates the accelerator grip 14 to increase a current supplied from the battery. In this case, the controller 3 performs a battery switching operation shown in the flowchart of FIG. 8.

When the controller 3 detects that the rider has performed an operation for accelerating the vehicle body, based on the signal from the grip sensor 18 (step S20), it selects the sub-battery 6 which has a higher SOC (step S21). In this case, preferably, the controller 3 selects the sub-battery 6 which has the highest SOC. On the other hand, when the controller 3 detects that the rider does not perform the operation for accelerating the vehicle body, it executes the same steps as those in the case of the normal travel of the vehicle body (step S27).

The controller 3 supplies the electric power from the selected sub-battery 6 to the electric motor 4 (step S22). When the SOC of this sub-battery 6 becomes less than the predetermined value in the middle of the travel (step S23), the controller 3 detects whether or not the SOCs of the remaining two sub-batteries 6 are less than the predetermined value (step S24). Or, the controller 3 may detect this in advance. If the SOCs of the remaining two sub-batteries 6 are equal to or greater than the predetermined value, the controller 3 returns to step S21. If the SOCs of all of the sub-batteries 6 are less than the predetermined value, the controller 3 switches the battery for supplying the electric power to the electric motor 4 to the main battery 95 (step S25).

When the controller 3 detects that the vehicle body continues to be accelerated based on the signal from the grip sensor 18 (step S26), it returns to step S25. On the other hand, when the controller 3 detects that the vehicle body is not accelerated, it executes the same steps as those in the case of normal travel of the vehicle body (step S27).

During the acceleration of the vehicle body, a current with a great magnitude is flowed through the electric motor 4. Therefore, the battery which has a higher SOC is preferably used to supply the electric power. In the above operation, since the battery which has a higher SOC is used preferentially to supply the electric power to the electric motor 4 during the acceleration of the vehicle body, the vehicle body can be accelerated smoothly.

Although the electric power is supplied preferentially from the sub-battery 6 to the electric motor 4 during the acceleration of the vehicle body, it may alternatively be supplied preferentially from the battery which has the highest SOC, among the main battery 95 and the sub-batteries 6, to the electric motor 4. Also, although the electric power is preferably supplied from the sub-battery 6 which has the highest SOC to the electric motor 4, it may alternatively be supplied simultaneously from the plurality of sub-batteries 6 to the electric motor 4. By supplying the electric power simultaneously from the plurality of sub-batteries 6 to the electric motor 4, the load imposed on the sub-batteries 6 can be dispersed. In this way, the load imposed on each of the sub-batteries 6 can be lessened. If only one sub-battery 6 is used, this sub-battery 6 is likely to generate heat in excess. Therefore, excessive heating of the sub-battery 6 can be prevented effectively, by supplying the electric power from the plurality of sub-batteries 6 to the electric motor 4.

The volume of the storage space of the top case 8 and the volume of the storage spaces of the side cases 80 can be selected flexibly. The sub-batteries with a greater capacity than the main battery can be placed in the storage spaces.

As described above, the mounting detecting sensor 84 detects that the terminals 60 of the sub-battery 6 are connected to the connection terminals 83. Alternatively, for example, when the controller 3 determines that the SOC of the sub-battery 6 is zero, it may determine that the sub-battery 6 is not mounted in any one of the top case 8 and the side cases 80. In other words, the controller 3 may be "sub-battery detecting section" of the present invention. Moreover, the mounting detecting sensor 84 may be replaced by a mounting detecting switch.

The location of the opening 81 of the top case 8 is not limited to the location of FIG. 3 so long as the location allows the sub-battery 6 to be stored in the top case 8.

Although in the above described embodiment, the feature of the present invention has been described using the electric motorcycle as an example, a technical idea of the present invention is also applicable to, for example, a four-wheeled vehicle or an all terrain vehicle (ATV).

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention is effectively applicable to vehicles such as a motorcycle into which a plurality of batteries are incorporated.

REFERENCE CHARACTER LIST

1 electric motorcycle
2 power plant
3 controller
4 electric motor
6 sub-battery
8 top case
30 power supply path
40 stator
41 rotor
42 rotary shaft
80 side case

The invention claimed is:

1. An electric vehicle comprising:
an electric motor mounted to a vehicle body to drive a wheel;
a main battery for activating the electric motor;
a plurality of sub-battery mounting sections to which a plurality of sub-batteries for activating the electric motor are detachably mounted;
a plurality of connection terminals to which a plurality of terminals of the sub-batteries mounted to the sub-battery mounting sections are connected;
a sub-battery detecting section for detecting that the connection terminals are connected to the terminals of the sub-batteries, wherein (a) the sub-batteries are configured to be mounted to the sub-battery mounting sections, respectively, (b) the plurality of sub-battery mounting sections are cases which are detachably mounted to the vehicle body, and (c) the cases have an opening through which cooling air is taken into the cases, and the opening is opened and closed by a lid member provided on the cases;
a state of charge (SOC) detecting section for detecting SOC of the main battery and SOC of the sub-batteries; and
a controller which is electrically connected to the electric motor, the main battery, the connection terminals, the sub-battery detecting section, and the SOC detecting section;
wherein the controller has a switching function in which:
when the sub-battery detecting section detects that the connection terminals are connected to the terminal of the sub-battery, and the SOC detecting section detects that the SOC of one of the sub-batteries is equal to or greater than a predetermined value, electric power is supplied preferentially from one of the sub-batteries to the electric motor during travel of a vehicle body, and
when the sub-battery detecting section detects that the connection terminals are connected to the terminals of the sub-batteries, and the SOC detecting section detects that the SOC of all of the sub-batteries are less than the predetermined value, the electric power is supplied from the main battery to the electric motor,
when the controller determines that a sub-battery is not stored in any of the cases, the controller turns on an unmounted state indicator lamp, and
when the unmounted state indicator lamp is turned off by a rider, the controller detects the SOC of the main battery.

2. The electric vehicle according to claim 1,
wherein the plurality of connection terminals correspond to the plurality of sub-batteries, respectively, the electric vehicle comprising:
an operation state detecting section which detects an operation state of an accelerator and is connected to the controller;
wherein the SOC detecting section is configured to detect SOCs of the plurality of sub-batteries mounted to the plurality of sub-battery mounting sections, respectively; and
wherein when the operation state detecting section detects an operation of an accelerator for accelerating the vehicle body, the controller supplies to the electric motor the electric power preferentially from the sub-battery which has a higher SOC, among the plurality of sub-batteries.

3. The electric vehicle according to claim 1,
wherein when the sub-battery detecting section detects that the connection terminals are connected to the terminals of the sub-batteries,
the controller supplies to the electric motor the electric power preferentially from the battery which has a higher SOC, among the main battery and the sub-batteries, during travel of the vehicle body, based on a result of the detection of the SOC detecting section.

4. The electric vehicle according to claim 2,
wherein when the operation state detecting section detects the operation of the accelerator for accelerating the vehicle body,
the controller supplies to the electric motor the electric power from the sub-battery which has a higher SOC, among the plurality of the sub-batteries.

5. The electric vehicle according to claim 1, comprising:
a falling detecting sensor for detecting that the vehicle body has fallen down;
wherein when the controller detects that the vehicle body has fallen down based on a signal output from the falling detecting sensor,
the controller stops supply of the electric power from the sub-batteries and the main battery to the electric motor.

6. The electric vehicle according to claim 1, comprising:
a regeneration means provided between the controller and the connection terminal and configured to recover electric energy by converting inertia rotational power of the electric motor into the electric energy which is charged into the sub-batteries or the main battery corresponding to the connection terminals.

7. The electric vehicle according to claim 1,
wherein the cases are located at a rear side of a seat which is mounted to the vehicle body and on which a rider is seated.

8. The electric vehicle according to claim 1,
wherein the electric vehicle is a motorcycle; and
wherein the cases include a top case, and one of the sub-batteries is stored in the top case.

9. The electric vehicle according to claim 1,
wherein the electric vehicle is a motorcycle; and
wherein the cases include a side case, and one of the sub-batteries is stored in the side case.

10. The electric vehicle according to claim 1,
wherein when the SOC detecting section detects that the SOC of one of the sub-batteries is less than the predetermined value, the controller notifies that the SOC of one of the sub-batteries is less than the predetermined value.

11. The electric vehicle according to claim 6,
wherein the controller preferentially charges the electric energy recovered by the regeneration means into the main battery or the sub-batteries which are less in the SOC.

12. The electric vehicle according to claim 1,
wherein when an operation for accelerating the vehicle body is detected, the controller selects the battery which is greater in the SOC, from the main battery and the sub-batteries.

13. The electric vehicle according to claim 1,
wherein when an operation for accelerating the vehicle body is detected, the controller supplies the electric power simultaneously from a plurality of batteries to the electric motor.

14. A method of driving an electric vehicle including:
an electric motor mounted to a vehicle body to drive a wheel;

a main battery for activating the electric motor;
a plurality of sub-battery mounting sections, which are detachably mounted to an outside surface of the vehicle body, and to which sub-batteries for activating the electric motor are detachably mounted;
a plurality of connection terminals to which terminals of the sub-batteries mounted to the sub-battery mounting sections are connected;
a sub-battery detecting section for detecting that the connection terminals are connected to the terminals of the sub-batteries, wherein (a) the sub-batteries are configured to be mounted to the sub-battery mounting sections, respectively, (b) the plurality of sub-battery mounting sections are cases which are detachably mounted to the vehicle body, and (c) the cases have an opening through which cooling air is taken into the cases, and the opening is opened and closed by a lid member provided on the cases; and
a SOC detecting section for detecting SOC of the main battery and SOC of the sub-batteries, the method comprising the steps of:
supplying electric power preferentially from the sub-batteries to the electric motor during travel of a vehicle body, when the sub-battery detecting section detects that the sub-batteries are mounted to the sub-battery mounting sections, and the SOC detecting section detects that the SOC of one of the sub-batteries is equal to or greater than a predetermined value; and
supplying the electric power from the main battery to the electric motor, when the sub-battery detecting section detects that the sub-batteries are mounted to the sub-battery mounting section and the SOC detecting section detects that the SOC of all of the sub-batteries are less than the predetermined value;
when the controller determines that a sub-battery is not stored in any of the cases, turning on an unmounted state indicator lamp; and
when the unmounted state indicator lamp is turned off by a rider, detecting the SOC of the main battery.

15. The electric vehicle according to claim 7,
wherein the cases include a top case and two side cases, both of which are located at a rear side of the seat, the side cases being mounted to both sides of a rear end portion of the seat.

16. The electric vehicle according to claim 1,
wherein the cases include a top case and a side case,
each of the top case and the side case is provided with the opening, and
the lid member is slidably attached on a back surface of the top case to expose and close the opening.

* * * * *